United States Patent [19]

Phelan

[11] Patent Number: 5,491,664
[45] Date of Patent: Feb. 13, 1996

[54] FLEXIBILTIY FOR COLUMN REDUNDANCY IN A DIVIDED ARRAY ARCHITECTURE

[75] Inventor: Cathal G. Phelan, Santa Clara, Calif.

[73] Assignee: Cypress Semiconductor Corporation, San Jose, Calif.

[21] Appl. No.: 127,241

[22] Filed: Sep. 27, 1993

[51] Int. Cl.$^6$ ............................. G11C 7/00; G11C 29/00
[52] U.S. Cl. ................. 365/200; 365/230.03; 371/10.2; 371/10.3
[58] Field of Search ............................. 365/200, 230.03; 371/10.2, 10.3

[56] References Cited

U.S. PATENT DOCUMENTS

| | | | |
|---|---|---|---|
| 4,660,179 | 4/1987 | Aoyama | 365/200 |
| 4,727,516 | 2/1988 | Yoshida | 365/200 |
| 4,807,191 | 2/1989 | Flannagan | 365/200 X |
| 4,837,747 | 6/1989 | Dosaka | 365/200 X |
| 4,908,798 | 3/1990 | Urai | 365/200 X |
| 4,918,662 | 4/1990 | Kondo | 365/200 X |
| 5,060,197 | 10/1991 | Park | 365/200 |
| 5,265,055 | 11/1993 | Horiguchi | 365/200 |
| 5,293,348 | 3/1994 | Abe | 365/230.3 |
| 5,295,101 | 3/1994 | Stephens | 365/200 |
| 5,359,560 | 10/1994 | Suh | 365/200 |

*Primary Examiner*—David C. Nelms
*Assistant Examiner*—Son Mai
*Attorney, Agent, or Firm*—Blakely, Sokoloff, Taylor & Zafman

[57] ABSTRACT

An apparatus and method for implementing flexible redundancy memory block elements in a divided array architecture scheme. The apparatus comprising the plurality of memory sub-arrays. Each of the memory sub-arrays includes a plurality of memory blocks having unique addresses and at least one redundancy memory block having a programmable element. Each of the memory sub-arrays is coupled to a plurality of global wordlines which are not uniquely addressed. The memory sub-arrays, namely the memory and redundancy memory blocks, are coupled to a true global read bus to allow the redundancy memory in one memory sub-array to be shared by another sub-array. The method comprises the steps needed to practice the present invention.

5 Claims, 8 Drawing Sheets

FLEXIBILTIY FOR COLUMN REDUNDANCY IN A DIVIDED ARRAY ARCHITECTURE

BACKGROUND OF THE INVENTION

1. Field of the Invention

The present invention relates to an apparatus and method for implementing flexible redundancy in a divided array architecture scheme. More particularly, the present invention relates to a semiconductor memory device comprising a plurality of memory sub-arrays within the divided array architecture scheme such that the redundancy memory within one of the plurality of memory sub-arrays is usable in any other sub-array.

2. Art Background

In today's semiconductor industry, semiconductor integrated circuit memory devices such as static random access memory (SRAMs), random access memory (RAMs), dynamic random access memory (DRAMs) and the like generally comprise a plurality of memory blocks in the integrated circuit. These memory blocks include a large number of binary elements (i.e., memory cells) for storage of binary data; namely, logic level "ones" and "zeros". The memory cells are arranged in a matrix of rows and columns. Addresses associated with a single memory array access memory locations within the array. Typically, decoding devices are coupled to the memory in order to decode a selected address signal for accessing a desired group of memory cells. The inputs to the array are provided on the wordlines, which usually select the "row" of the address, while the outputs from the array are provided on the bitlines. The bitlines select the "column" of the address.

In the manufacture of such memory arrays, processing defects often randomly occur within the memory chip. In most instances, these memory chips are fully functional except for a single or a small number of rows or columns containing defective memory cell(s). In order to prevent unnecessary scrapping of the chip for having a small number of defects, defect tolerant memory devices have been devised in which redundancy memory is substituted for a selected row and/or column of defective memory.

For many years, redundancy memory had been used strictly for single memory arrays. At that time, semiconductor memory manufacturers had designed and fabricated semiconductor memory devices with a single memory array 1 divided into a plurality of memory blocks 2a–2n as shown in FIG. 1. These memory blocks 2a–2n include at least one block of redundancy memory 2n. Reading data from and writing data into a desired group of memory cells 3 along a local wordline 4 was accomplished by activating the group of memory cells 3 through decoding. The decoding was accomplished in two steps. First, a physical address of a desired memory block containing the group of memory cells 3 is inputted into decoding logic 5 which, in turn, activates the memory block containing the desired group of memory cells 3. As an example, for illustrative purposes, the desired memory block is a first memory block 2a of the plurality of memory blocks 2a–2n. Concurrently therewith, using the same decoding procedure with respect to decoding logic 7, a set of global wordlines 6a–6n including the local wordline 4 is activated, which results in the group of memory cells 3 becoming accessible.

If any block of memory within the single memory array 1 becomes defective, a block of redundancy memory 2n is directly mapped into the physical address of the defective memory block in order to replace the defective memory block. However, such architecture was extremely slow because it required longer read and write signal lines (not shown) between each block in the array and the redundancy memory which, in turn, causes greater read access time delays.

In order to overcome speed limitations associated with the single memory array architecture, semiconductor memory manufacturers began to design and fabricate divided array memory architectures. An example of such architecture is illustrated in FIG. 2, wherein the memory array 10 is divided into four identical sub-arrays 11–14, each of which having eight blocks of memory 11a–11h through 14a–14h and one block of redundancy memory block 11i–14i. The sub-arrays 11–14 are addressed by conventional decoding logic 18 which is coupled to each of the sub-arrays 11–14 through decoding signal lines 20–28. More specifically, the decoding signal lines 20–28 are respectively coupled to every memory block 11a–14i within the sub-arrays 11–14, including all the redundancy memory blocks 11i–14i. Although FIG. 2 shows a specific example, it is apparent that the memory array 10 could be divided into any number of sub-arrays or memory blocks.

In conventional divided array architecture scheme, each block in the memory sub-arrays shares a common physical address with at least one other block in another sub-array. For example, a first block 11a of a first memory sub-array 11 may have the same physical address as a first block 12a–14a of a second, third and fourth memory sub-arrays 12–14 respectively, a second block 11b of a first memory sub-array 11 may have the same physical address as second blocks 12b–14b of other sub-arrays 12–14 and so on.

Although a memory block in each sub-array 11–14 is activated at any one time, only one group of memory cells 16 is accessed. This is due to the fact that each of the memory sub-arrays 11–14 is coupled to an uniquely addressed set of global wordlines 15a–15n, which is decoded by conventional decoding logic 19. The combination of activating both the memory blocks 11–14 and the unique global wordline 15a–15n, where "n" is equal to any whole number, enables access to the desired group of memory cells 16 along a local wordline 17. As shown in FIG. 2, the local wordline 17 is a subsection of the global wordline 15a within the activated memory block 11a. The operation of conventional divided array architectures may be better explained through an example.

If access to certain memory cells in a first block 11a of a first sub-array 11 is desired, the address of the desired block would be decoded by the decoding logic 18 and as a result, four blocks 11a, 12a, 13a and 14a (one for each sub-array) would be accessed because they share an identical physical address. However, since the global wordlines 15a–15n are uniquely addressed, only one wordline, namely wordline 15a, would be activated and thereby allowing the group of memory cells 16, within the first memory block 11a and along the local wordline 17, to be accessed.

An advantage of the conventional divided array architecture over the single array architecture is better overall system performance through quicker memory access time because the read and write signals (not shown) of a divided memory array 10 have to propagate a shorter distance than those in the single memory array 1. However, a disadvantage associated with the divided array architecture is that it is not as flexible as the single array architecture because the redundancy memory blocks 11i–14i are divided so as to support only its corresponding memory sub-arrays 11–14.

As a result, redundancy memory stored in one of the plurality of memory sub-arrays cannot be used in any other memory sub-array. In the embodiment in FIG. 2, redundancy memory 11*i* from a first memory sub-array 11 could not be used in memory sub-arrays 12–14 and so on.

The present invention incorporates a divided array architecture as illustrated in FIG. 2 to enhance system performance by decreasing memory access time, but also preserves flexibility associated with unrestricted use of redundancy memory as in the single array architecture shown in FIG. 1. Based on the foregoing, it would be desirable to have flexible redundancy memory in a divided array architecture. Therefore, it is an object of the present invention to provide an apparatus and method for implementing a plurality of memory sub-arrays within a divided array architecture scheme such that redundancy memory within one of the plurality of memory sub-arrays is usable by any other sub-array.

Accordingly, it is another object of the present invention to provide an apparatus and method for repairing defective memory blocks by mapping redundancy blocks into a physical address of the defective memory blocks.

Another object of the present invention is to provide an apparatus and method to increase a yield of functional memory semiconductor devices.

Yet, it is another object of the present invention is to provide an apparatus and method for allowing :memory sub-arrays within a divided array architecture to use redundancy memory interchangeably.

SUMMARY OF THE INVENTION

The present invention relates to an apparatus and method for implementing flexible redundancy memory blocks in a divided array architecture scheme incorporating a plurality of memory sub-arrays, and more particularly, relates to a plurality of redundancy memory blocks capable of being used within each of the plurality of memory sub-arrays.

The apparatus comprises the plurality of memory sub-arrays, wherein each of the memory sub-arrays includes a plurality of memory blocks and at least one redundancy memory block having a programmable element. Each of the memory sub-arrays is coupled to a plurality of global wordlines, which are not uniquely addressed, so that activation of one of the plurality of wordlines in a first memory sub-array activates a corresponding wordline in another memory sub-array. On the contrary, the plurality of memory blocks in all of the sub-arrays are unique addresses so that, when decoded, only one memory block is accessed at a time. The memory sub-arrays, namely the memory and redundancy memory blocks, are coupled to a true global read bus which, in turn, allows the redundancy memory in one memory sub-array to be shared by another sub-array.

The method for enabling at least one redundancy memory block in one of a plurality of memory sub-arrays within a divided array architecture to be used in another of the plurality of memory sub-arrays, the method comprising six steps. First, a plurality of memory sub-arrays are formed from a single memory array, wherein each of the plurality of memory sub-arrays having a plurality of memory blocks and at least one redundancy memory block. Second, a first decoder is coupled to the plurality of memory blocks and the at least one redundancy memory block. Next, each of said plurality of memory blocks is configured to be uniquely addressable. Thereafter, a read bus including at least one read bus line is coupled to the plurality of memory blocks in the plurality of memory sub-arrays. Next, a programmable element is coupled to each of the at least one redundancy memory block, wherein the programmable element is further coupled to each of the at least one read bus line. Lastly, a plurality of wordlines couples a second decoder with the plurality of memory blocks and the at least one redundancy memory within each memory sub-array, wherein the plurality of wordlines are not uniquely addressable.

DETAILED DESCRIPTION OF THE INVENTION

An apparatus and method is described for providing a memory device having a divided array architecture with flexible redundancy memory. In the following detailed description, specific memory architectures are set forth in order to provide a thorough understanding of the present invention. Such specific architectures have been used for the sole purpose of illustrating the differences in operation between a conventional divided array memory device and the present invention. It is apparent, however, to one of ordinary skill in the art, that the present invention may be practiced without incorporating such specific architecture which should in no way be construed as a limitation on the scope of the present invention. In other instances, well known structures and operations, such as conventional components for decoding purposes, have not been described in detail in order not to unnecessarily obscure the present invention.

Figure 3:
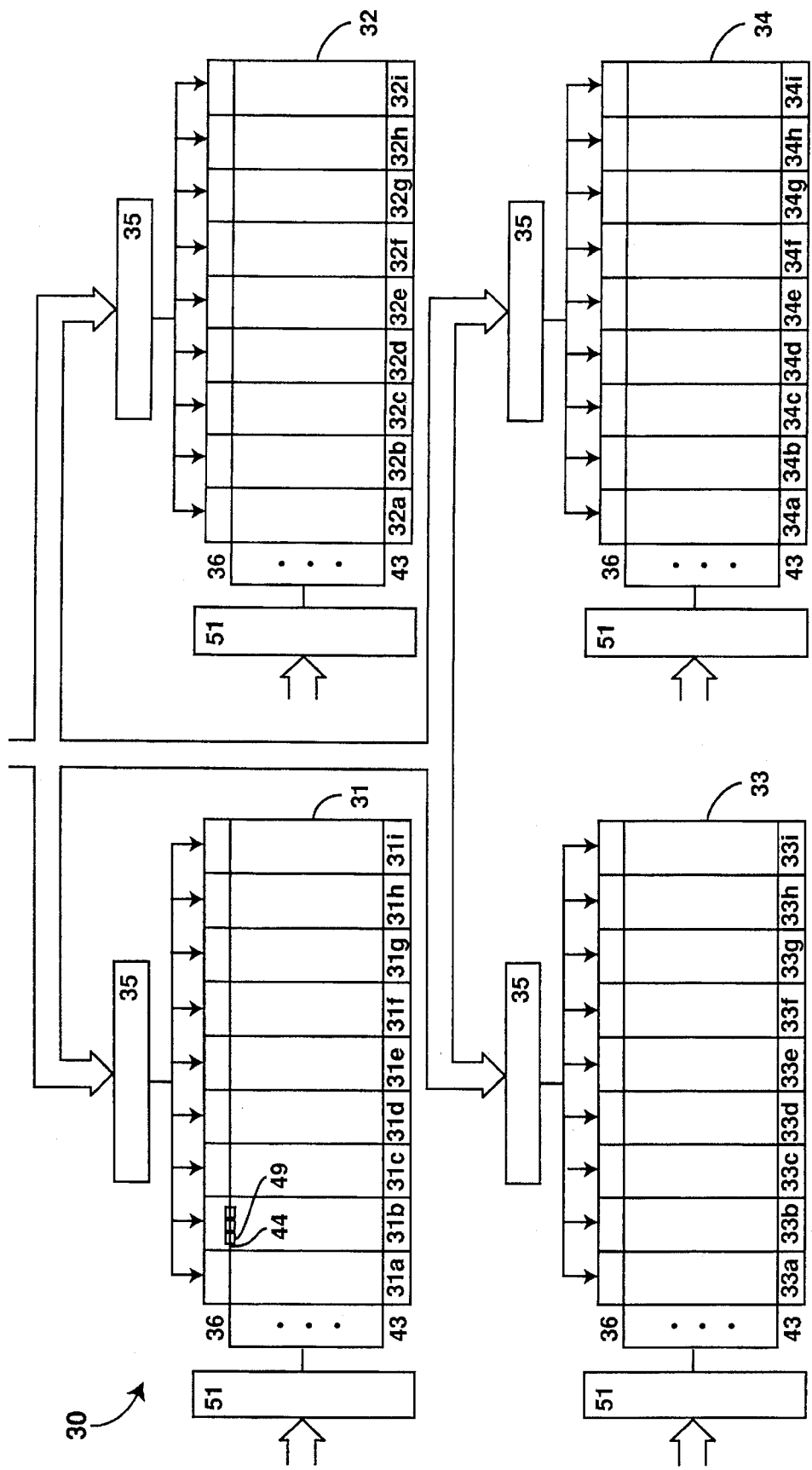
FIG. 3 is a block diagram of one embodiment of the present invention employing a divided array architecture scheme which enables redundancy memory to be used in any of the memory sub-arrays.

One embodiment of the present invention is illustrated in FIG. 3 which shows a specific architecture scheme; namely, a memory array 30 having four memory sub-arrays 31–34. Each of the four sub-arrays 31–34 has eight blocks of memory 31*a*–31*h* through 34*a*–34*h*, plus an additional redundancy memory block 31*i*–34*i*. As previously mentioned herein, this specific embodiment lends itself to explaining the present invention and in no way should be construed as a limitation on the scope of the invention. Rather, the number of memory sub-arrays, memory blocks and redundancy memory blocks is merely a design choice.

Figure 1:
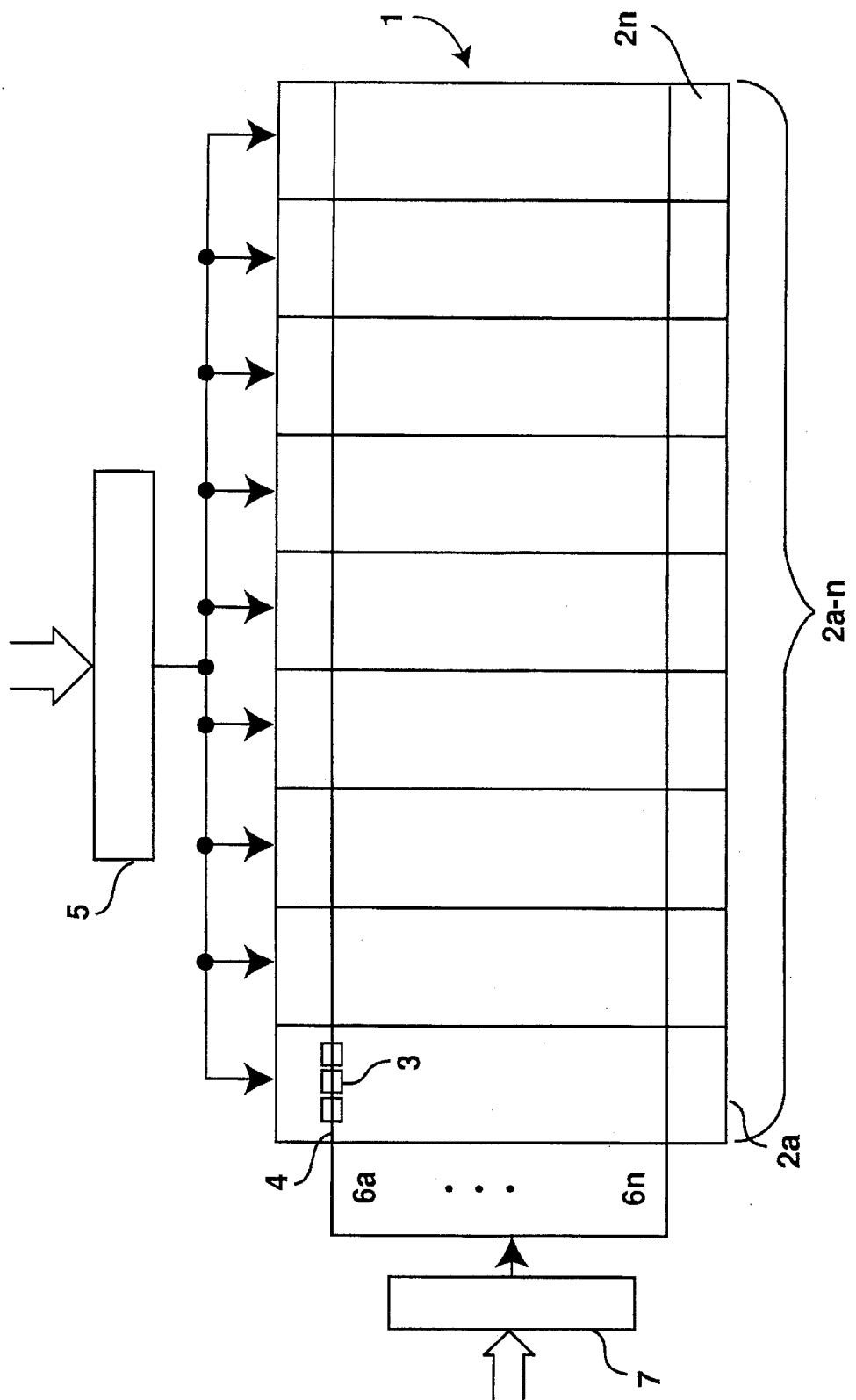
FIG. 1 is a block diagram of a conventional semiconductor memory device having a single memory array with at least one block of redundancy memory.
Figure 2:
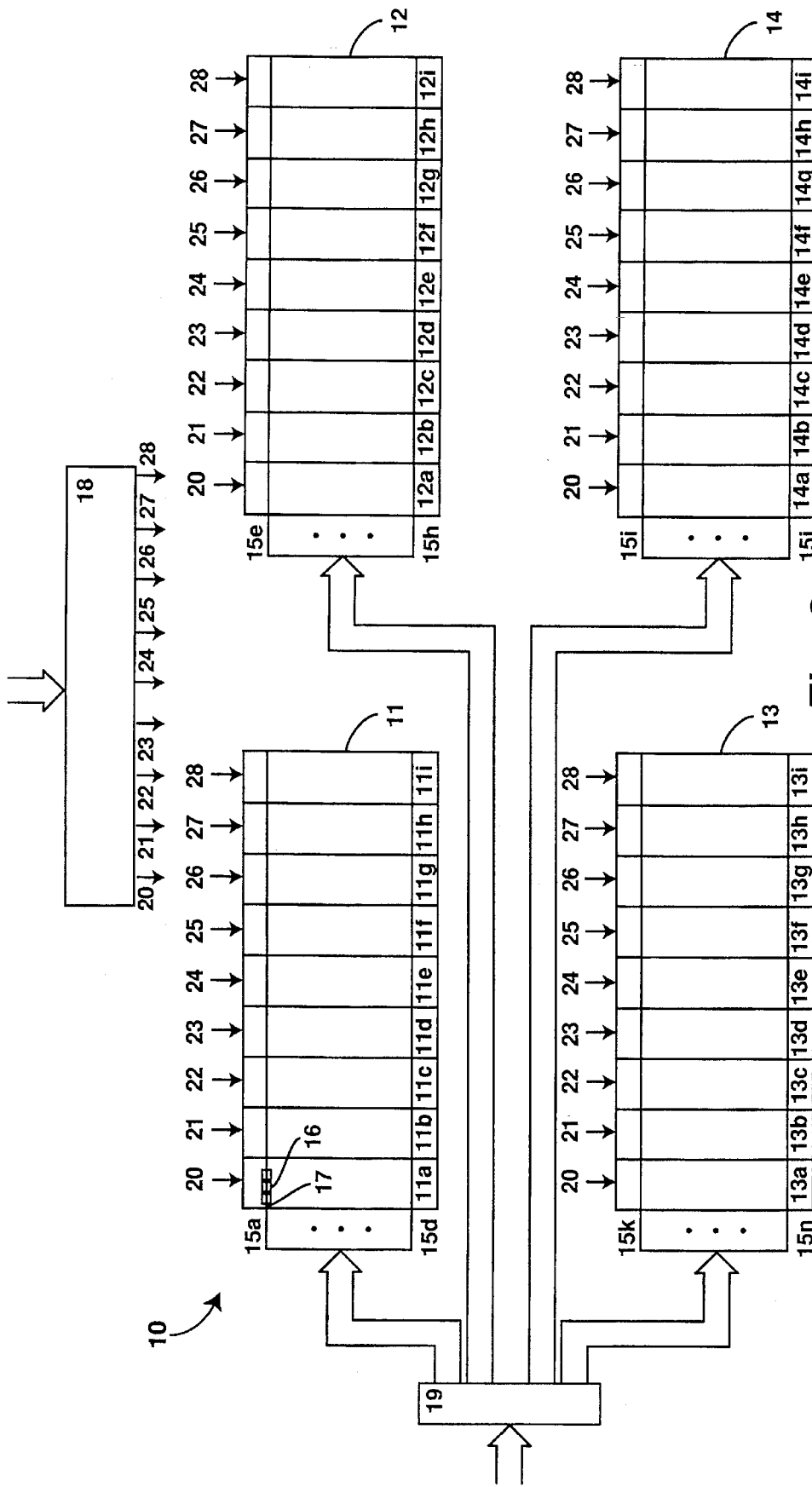
FIG. 2 is a block diagram of a conventional semiconductor memory device employing a divided array architecture scheme such that a single memory array is divided up into four sub-arrays with redundancy memory in each memory sub-array.

Contrary to the conventional divided-array architecture 10 shown in FIG. 2, each of the memory blocks 31a–31h through 34a–34h in the sub-arrays 31–34 as well as the redundancy memory blocks 31i–34i are uniquely decoded through conventional decoding logic 35, which can be programmable. As a result, each memory block 31a–31i through 34a–34i in the sub-arrays 31–34 has an unique physical address. Thus, when an address signal is inputted into the decoding logic 35, only one memory block is activated.

The plurality of wordlines 36–43, on the other hand, are global and are not uniquely addressed such that the wordlines 36–43 of each of the four sub-arrays 31–34 have identical addresses. As a result, the four memory sub-arrays 31–34 may be viewed as a single array with a continuous wordline allowing the redundancy elements 31i–34i in each sub-array 31–34 to be mapped into any of the memory block 31a–31h through 34a–34h, even those of another sub-array, since the global wordlines 36–43 in each sub-array are similarly addressed by conventional decoding logic 51.

To illustrate the operation of the present invention, let us presume, for example, that access to a particular group of memory cells 49 is desired. As shown in FIG. 3, the group of memory cells 49 are stored in the second block 31b of the first memory sub-array 31 along a first global wordline 36. An address signal would be inputted into conventional decoding logic 51, which could be conventionally programmable, in order to activate the global wordline 36. As a result, an identically addressed global wordline 36 in each of the other sub-arrays 32–34 is addressed. Concurrently, the address signal would be inputted into the conventional decoding logic 35. However, since each memory block has an unique address, only the second memory block 31b within the first memory sub-array 31 would be selected in all of the memory sub-arrays 31–34. Thus, there is only one location, at a local wordline 44, where both the memory block and the global wordline are active (i.e., where the memory block address and global wordline address intersect).

From a memory block perspective, there are no memory sub-arrays, only one large memory array with thirty-two (32) individually addressed memory blocks 31a–31h through 34a–34h. However, with respect to a global wordline perspective, there are four sub-arrays 31–34 thereby enabling four identically addressed global wordlines at any one time.

Figure 4:
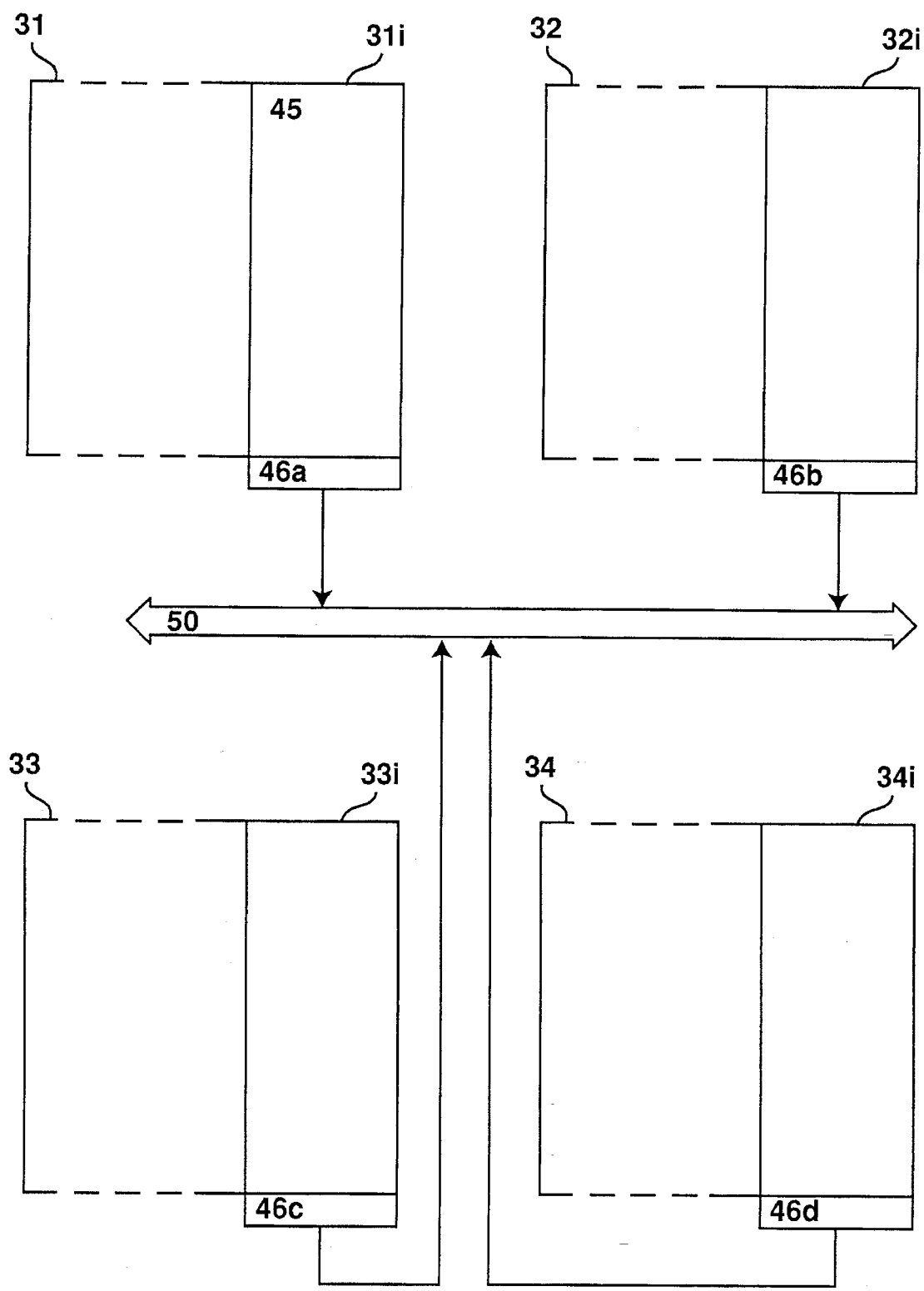
FIG. 4 is a block diagram of one embodiment of the redundancy memory having programmable sense amplifiers.

As shown in FIG. 4, each programmable redundancy memory block 31i–34i includes a plurality of memory cells 45 arranged in rows and columns which correspond to each of the plurality of memory blocks 31a–31h through 34a–34h. However, it is also contemplated that each redundancy memory block 31i–34i could be designed as at least one column of memory cells having a number of memory cells equivalent to a number of memory cells within a column of the memory blocks as shown in FIG. 5. Each of the redundancy memory blocks 31i–34i further includes a programmable element such as, for example, a sense amplifier 46a–46d, which is capable of being coupled to any read bus line within a "true" global read bus 50.

Figure 5A:
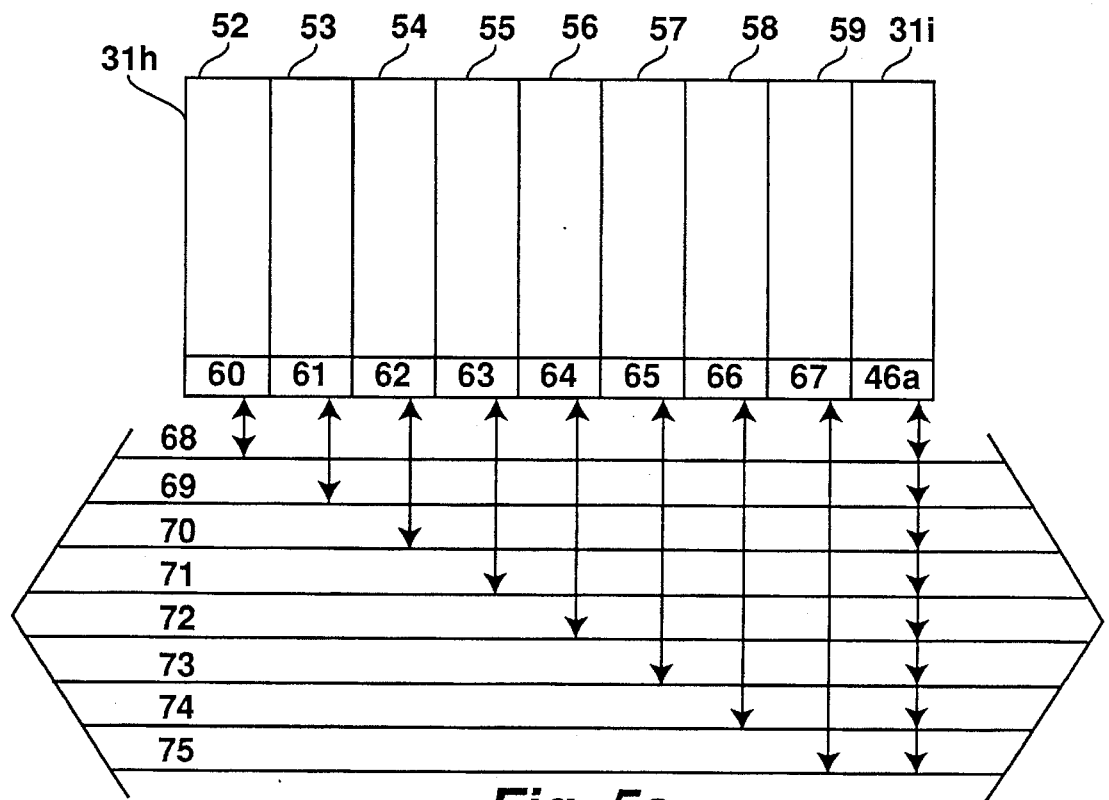
FIG. 5*a* is a block diagram of one embodiment of the programmable element used in connection with a first redundancy memory.
Figure 5B:
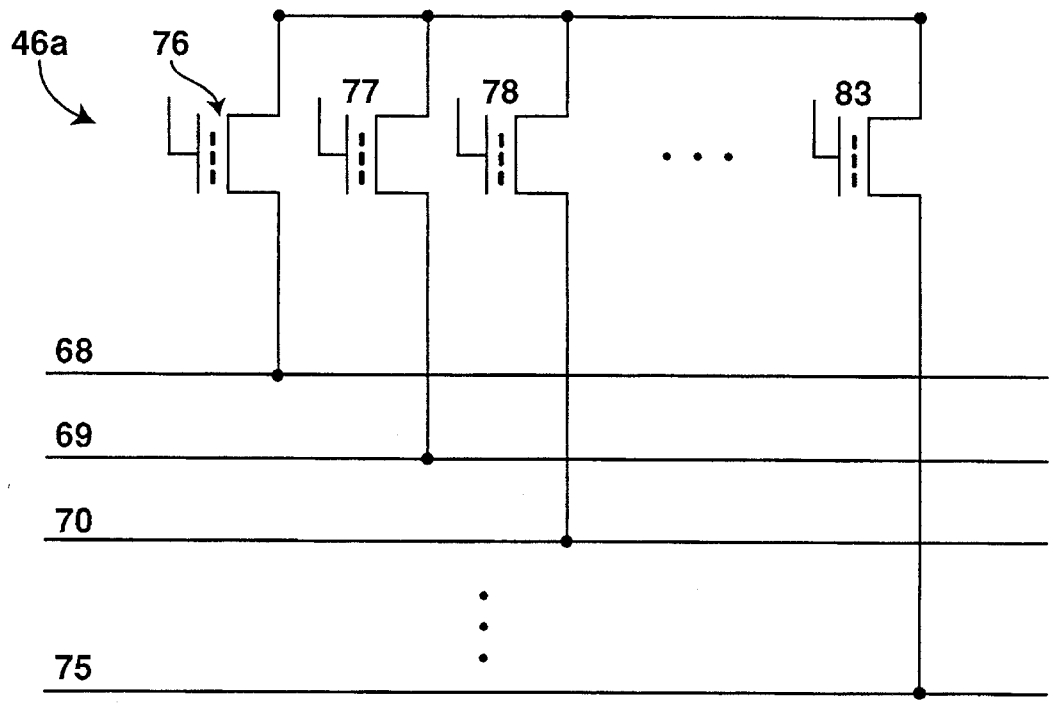
FIG. 5*b* is a more detailed block diagram of the embodiment of the programmable element as illustrated in FIG. 5*a*.

FIGS. 5a and 5b illustrate in greater detail the operation of a programmable element as shown in FIG. 4. Since each of the programmable elements 46a–46d coupled to the redundancy memory blocks are equivalent, for the sake of clarity, only a first redundancy memory block 31i in combination with an eighth memory block 31h of the first memory sub-array 31 are shown. Moreover, for illustrative purposes, the eighth memory block 31h is shown to have eight columns 52–59, wherein each of the columns is one cell wide and contains a plurality of memory cells. However, the column width and number of columns is a design choice. Each column of cells 52–59 within the redundancy memory block 31i is coupled to a corresponding sense amplifiers 60–67, or alternatively, the columns of cells may be coupled to one sense amplifier in order to maximize area usage within the divided array architecture scheme. The sense amplifiers drive data into predetermined read bus lines. In this illustration, the read bus 50 is shown to have eight read bus lines 68–75 in order to correspond with the number of columns of memory cells per memory block; however, it is contemplated that the read bus 50, in combination with conventional logic, may be designed to have less read bus lines than columns of memory cells.

FIG. 5b shows one embodiment of the programmable elements, wherein the programmable element 46a of the first redundancy block comprises a plurality of floating gates, fuses or any other similar connecting element. Since eight read bus lines 68–75 are chosen in the embodiment of FIG. 5, there also exists eight floating gates 76–83, wherein each of the floating gates 76–83 share a common source; namely, a bitline used to activate the column of cells within the redundancy memory 31i. However, the drains of the floating gates 76d–83d are coupled to the eight read bus lines 68–75 respectively. This allows the redundancy memory 31i to be programmed to output data onto any of the read bus lines 68–75 within the global read bus 50.

Figure 6A:
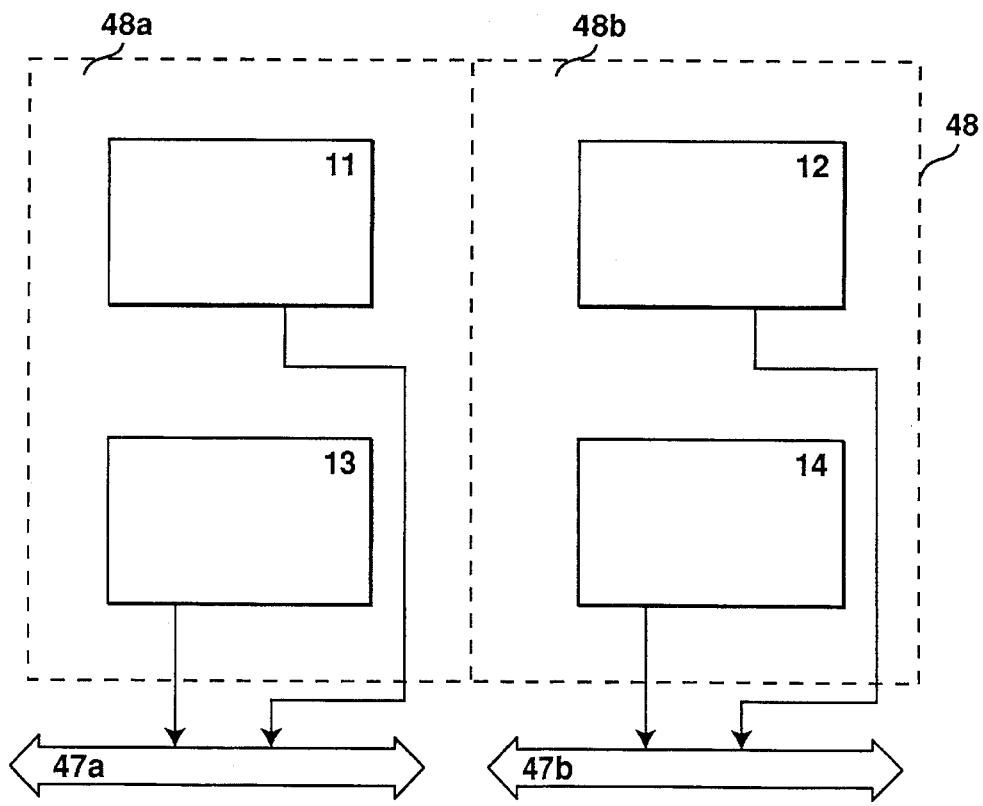
FIG. 6*a* is a block diagram of a multiple read bus scheme employed by conventional divided array architecture.

In addition to the unique addressing of the memory blocks for each of the memory sub-arrays 31–34, the present invention includes a read path which is designed so as to be used in connection with the global read bus 50. As shown above in FIG. 6a, conventional divided memory architectures normally split up their read bus into two or more global read buses 47a and 47b. A first of the two read buses 47a usually services a specific section of a semiconductor chip 48, such as the left portion of the chip 48a, while a second read bus 47b services the other section (i.e., a right half of the chip 48b). Splitting the read bus may provide marginal access time savings by reducing capacitive loading; however, it does not provide a flexible redundancy scheme which allows redundancy memory to be used by each and every memory sub-array in a divided array architecture.

Figure 6B:
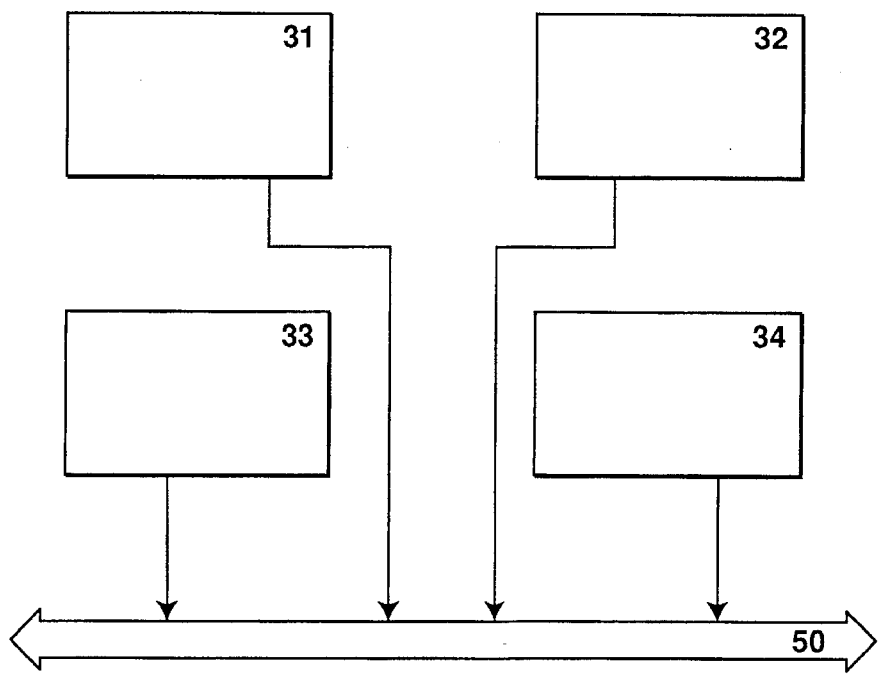
FIG. 6*b* is a block diagram of the present invention incorporating a global read bus scheme.

In the present invention, in order to achieve to total flexibility with respect to the redundancy memory 31i–34i so that memory redundancy from the first sub-array 31 can be used in any of the other sub-arrays 32–34, every sub-array 31–34 must utilize the same global read bus as shown in FIG. 6b. There can be no multiplexing of multiple global busses as previously utilized in conventional divided memory architectures in FIG. 6a. Rather, the present invention must have the "true" global bus 50 serving all memory blocks 31a–31i and 34a–34i in all of the sub-arrays 31–34. As a result of using the "true" global bus 50, complete or partial block replacement is simple.

Figure 7:
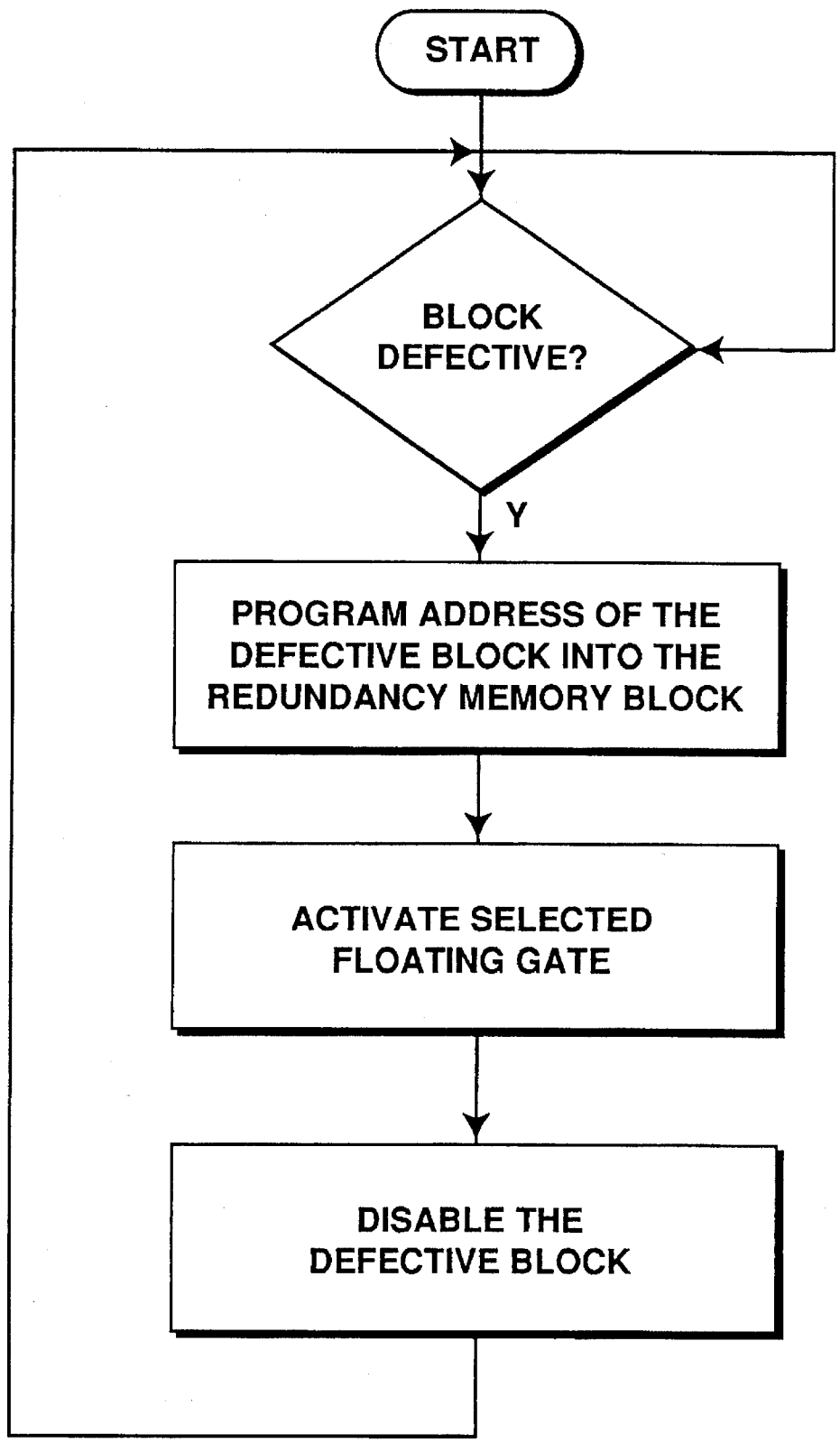
FIG. 7 is a flowchart of the operation of the redundancy memory block to replace the defective memory block.

FIG. 7 illustrates the operation of the redundancy memory block upon detection of a defective memory block. First, upon detection of a defective memory block, the unique address of the defective block is programmed into a selected redundancy element. Next, a selected floating gate is activated so-that the selected redundancy memory is coupled to the same read bus line as the defective memory block.

Finally, the defective memory block is permanently disabled by, for example, disabling its corresponding sense amplifier.

Figure 8:
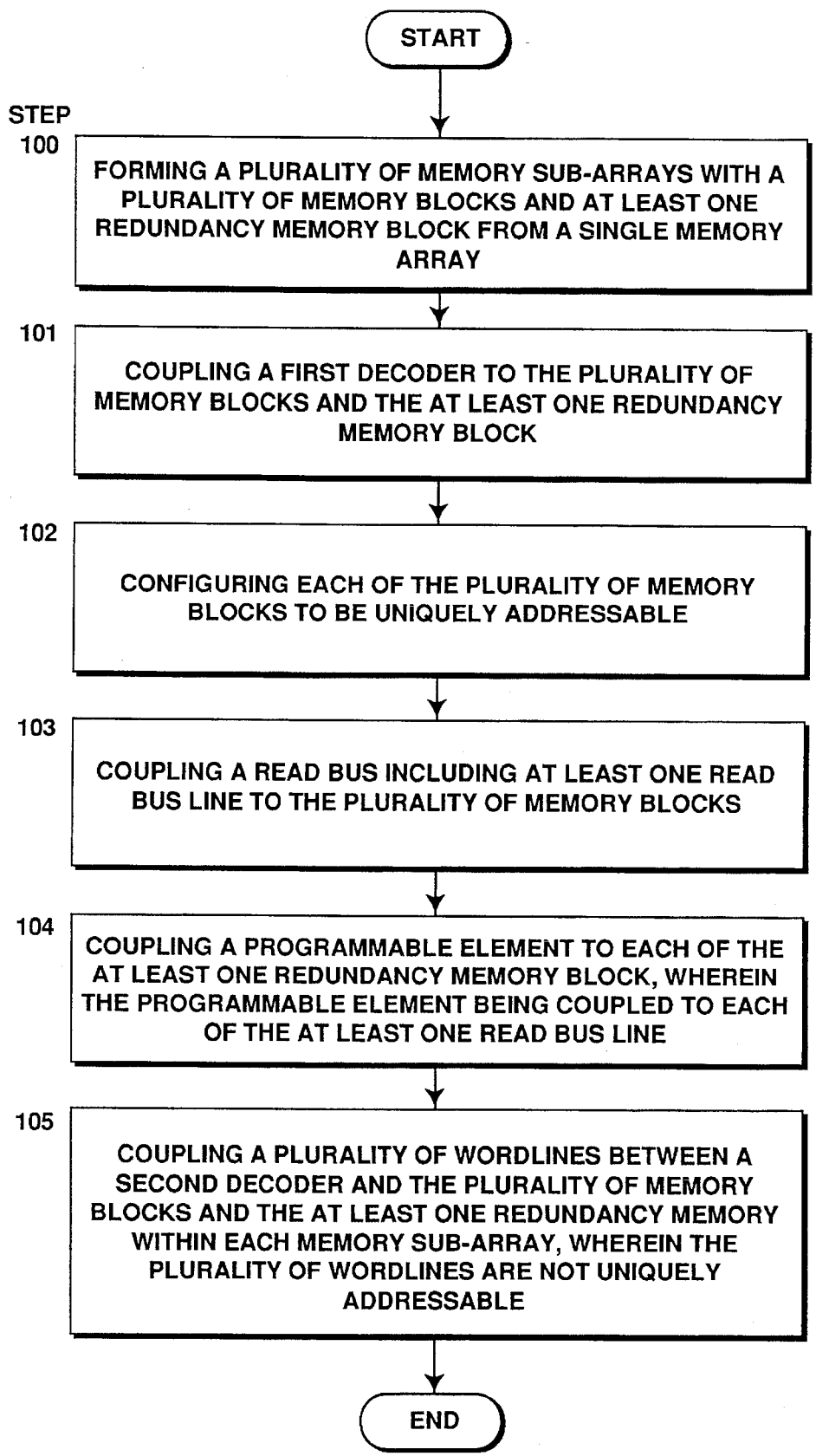
FIG. 8 is a flowchart outlining the steps necessary to implement the present invention.

The following is a detailed description of the method for providing the divided array architecture scheme having flexible redundancy memory as shown in FIG. 8. In Step 100, the memory array is formed into a plurality of memory sub-arrays, each memory sub-array having a plurality of memory blocks and at least one redundancy memory blocks. In Step 101, a first decoder is coupled to the plurality of memory blocks and the at least one redundancy memory block element in the plurality of memory sub-arrays. In Step 102, each of the plurality of memory blocks is configured to have an unique address so that only one of said plurality of memory blocks in said plurality of memory sub-arrays is selected by the first decoder at any time. In Step 103, the plurality of memory blocks are coupled to a true global read bus which includes a plurality of read bus lines. In Step 104, each of the redundancy memory blocks in the plurality of memory sub-arrays is coupled to a programmable element, such as, for example, a programmable sense amplifier, in order to enable the redundancy block to replace any defective memory block. These programmable elements are coupled to any read bus line within the read bus. In Step 105, a plurality of wordlines are coupled with the plurality of memory blocks and the at least one redundancy block in order to provide assistance in activating a desired group of memory cells along a local wordline. The plurality of wordlines are not uniquely addressable.

The combination of these steps allows the redundancy memory to be used regardless of position in the memory array since any of the redundancy memory block elements can be programmed to have the same physical address and identical coupling to the true global read bus as the defective memory block. Thereafter, any memory access requests to the defective memory block will be mapped into the redundancy memory block.

The present invention described herein may be designed in many different methods and using many different memory architecture schemes. While the present invention has been described in terms of various embodiments, other embodiments may come to mind to those skilled in the art without departing from the spirit and scope of the present invention. The invention should, therefore, be measured in terms of the claims which follow.

We claim:

1. A memory device operating in an architecture scheme having a plurality of memory sub-arrays, said memory device comprising:

a storage element, said storage element being uniquely addressed;

an activating element for activating at least one memory cell within said storage element;

a first selecting element for selecting said storage element and being coupled to said storage element;

a second selecting element for selecting said activating element and being coupled to said activating element;

a bus element for reading information from said at least one memory cell within said storage element, wherein said bus element is coupled to said storage element; and an alternative storage element for alternatively storing information in the event that said storage element is defective permanently disabling said defective storage element and programming an unique address of said defective storage element for said alternative storage element, said alternative storage element being coupled to said activating and bus elements, wherein said defective storage element and said alternative storage element are located in either the same or separate of said plurality of memory sub-arrays, said alternative storage element including at least one redundancy memory block, wherein said at least one redundancy memory block includes a programmable element, and wherein said programmable element includes a sense amplifier.

2. A memory device operating in an architecture scheme having a plurality of memory sub-arrays for storing data, a location for storing binary data is obtained from an address signal including a block address and a wordline address, said memory device comprising:

at least one decoder for decoding the address signal and activating a selected memory block and at least one selected wordline;

a plurality of memory blocks for each of said plurality of memory sub-arrays coupled to said at least one decoder, said plurality of memory blocks containing a predetermined number of memory cells for storing data, each of said plurality of memory blocks contained within said plurality of sub-arrays having an unique block address so that only a selected one of said plurality of memory blocks in said plurality of memory sub-arrays is activated by said decoder at any time;

a plurality of wordlines for each of said plurality of memory sub-arrays coupled to said at least one decoder, wherein said plurality of wordlines have global wordline addresses so that at least one of said plurality of wordlines in each of said plurality of memory sub-arrays is activated by said at least one decoder;

a global read bus for reading said data from said plurality of memory cells within said selected memory block, wherein said global read bus is coupled to at least one bitline from said plurality of memory blocks and wherein said global read bus comprises a plurality of read bus lines; and at least one redundancy memory block coupled to said global read bus, wherein said at least one redundancy memory block includes a programmable element for permanently coupling a bitline from said redundancy memory block to any read bus line in said plurality of read bus lines, wherein said at least one redundancy memory block can replace any of said plurality of memory blocks in any of said plurality of memory sub-arrays.

3. The memory device according to claim 2, wherein the programmable element includes a sense amplifier.

4. An integrated circuit memory device for storing data, said memory device comprising:

a first decoder for decoding an address;

a plurality of memory sub-arrays on said integrated circuit, each of said plurality of memory sub-arrays comprising a plurality of memory blocks containing a plurality of memory cells for storing data, each of said plurality of memory blocks being coupled to said first decoder and having an unique block address so that only one of said plurality of memory blocks in said plurality of memory sub-arrays is selected by said first decoder at any time;

a second decoder for decoding an address signal;

a plurality of wordlines for each of said plurality of memory sub-arrays, said plurality of wordlines being coupled to said second decoder, wherein said plurality of wordlines have global wordline addresses such that at least one of said plurality of wordlines in each of said plurality of memory sub-arrays is selected by said second decoder;

a read bus for reading said data, said read bus being coupled to each of said plurality of memory sub-arrays, said read bus having a plurality of read bus lines; and at least one redundancy memory block coupled to said first decoder and coupled to said read bus, said at least one redundancy memory block comprising a programmable element for permanently coupling an output from said at least one redundancy memory block to any read bus line of said plurality of read bus lines, wherein said at least one redundancy memory block can replace any of said plurality of memory blocks in any of said plurality of memory sub-arrays.

5. A method for providing flexible redundancy memory with a divided array architecture scheme, said method comprising the steps of:

forming a plurality of memory sub-arrays from a single memory array, each of said plurality of memory sub-arrays having a plurality of memory blocks and at least one redundancy memory block;

coupling a first decoder to said plurality of memory blocks and the at least one redundancy memory block;

configuring each of said plurality of memory blocks to be uniquely addressable so that only one of said plurality of memory blocks in said plurality of memory sub-arrays is addressed at any time;

coupling a read bus including at least one read bus line to said plurality of memory blocks in said plurality of memory sub-arrays;

coupling a programmable element to each of said at least one redundancy memory block, wherein said programmable element is permanently coupled to each of said at least one read bus line; and coupling a plurality of wordlines between a second decoder and the plurality of memory blocks and the at least one redundancy memory within each memory sub-array, wherein said plurality of wordlines are not uniquely addressable.

* * * * *